United States Patent
Shimojoh

(10) Patent No.: US 8,994,907 B2
(45) Date of Patent: Mar. 31, 2015

(54) DISPLAY UNIT COMPRISING A SUBSTRATE COVER THAT HAS A SCREW COVERING REGION

(75) Inventor: Kazuya Shimojoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 79 days.

(21) Appl. No.: 13/885,756

(22) PCT Filed: Nov. 10, 2011

(86) PCT No.: PCT/JP2011/075921
§ 371 (c)(1), (2), (4) Date: May 16, 2013

(87) PCT Pub. No.: WO2012/067007
PCT Pub. Date: May 24, 2012

(65) Prior Publication Data
US 2013/0229593 A1    Sep. 5, 2013

(30) Foreign Application Priority Data

Nov. 17, 2010 (JP) .................................. 2010-257097

(51) Int. Cl.
*G02F 1/1345* (2006.01)
*H05K 1/02* (2006.01)
*H05K 7/06* (2006.01)
*G02F 1/1333* (2006.01)

(52) U.S. Cl.
CPC .......... *H05K 1/0271* (2013.01); *G02F 1/13452* (2013.01); *G02F 2001/133314* (2013.01); *H05K 7/06* (2013.01)

USPC .......................................... 349/151; 349/152

(58) Field of Classification Search
CPC ............................... H05K 1/0271; H05K 7/06
USPC ..................................................... 349/149–152
See application file for complete search history.

(56) References Cited

U.S. PATENT DOCUMENTS

| 4,084,478 A * | 4/1978 | Simmons ....................... 411/404 |
| 2007/0035689 A1* | 2/2007 | Ryu ............................... 349/149 |
| 2007/0279568 A1* | 12/2007 | Kim ............................... 349/149 |
| 2008/0079888 A1* | 4/2008 | Park ............................... 349/149 |

FOREIGN PATENT DOCUMENTS

| JP | 11-065483 A | 3/1999 |
| JP | 2000-047209 A | 2/2000 |
| JP | 2003066483 A * | 3/2003 ............ G02F 1/1345 |

OTHER PUBLICATIONS

Official Communication issued in International Patent Application No. PCT/JP2011/075921, mailed on Dec. 6, 2011.

* cited by examiner

*Primary Examiner* — Paul Lee
(74) *Attorney, Agent, or Firm* — Keating & Bennett, LLP

(57) ABSTRACT

In a display unit, measures against dropping of screws can be realized at low cost. The display unit includes: a wiring substrate in which wiring that is led out from a display panel is provided; a screw that fixes the wiring substrate to the display unit; and a substrate cover that covers the wiring substrate. The substrate cover has a screw covering region that covers a head of the screw, and part of the periphery of the screw covering region is separated from the other area of the substrate cover.

7 Claims, 6 Drawing Sheets

DISPLAY UNIT COMPRISING A SUBSTRATE COVER THAT HAS A SCREW COVERING REGION

TECHNICAL FIELD

The present invention relates to a display unit provided with a display panel.

BACKGROUND ART

In a display unit provided with a display panel, for example, screws are used for fixing the display panel to a chassis. Along with a reduction in thickness of the display unit, the screws also are required to be compact. However, in some cases, such compact screws loosen due to vibrations, etc., and drop off in the worst case. For preventing dropping of screws, various measures such as adjustment of a torque, adoption of a washer and a screw lock have been taken (for example, see JP 11(1999)-065483 A).

PRIOR ART DOCUMENT

Patent Document

Patent Document 1: JP 11(1999)-065483 A

SUMMARY

A display unit disclosed in the present application is a display unit provided with a display panel, including: a wiring substrate in which wiring that is led out from the display panel is provided; a screw that fixes the wiring substrate to the display unit; and a substrate cover that covers the wiring substrate. The substrate cover has a screw covering region that covers a head of the screw, and the screw covering region is separated from the other area of the substrate cover in part of the periphery of the head of the screw.

EMBODIMENT

Figure 1:
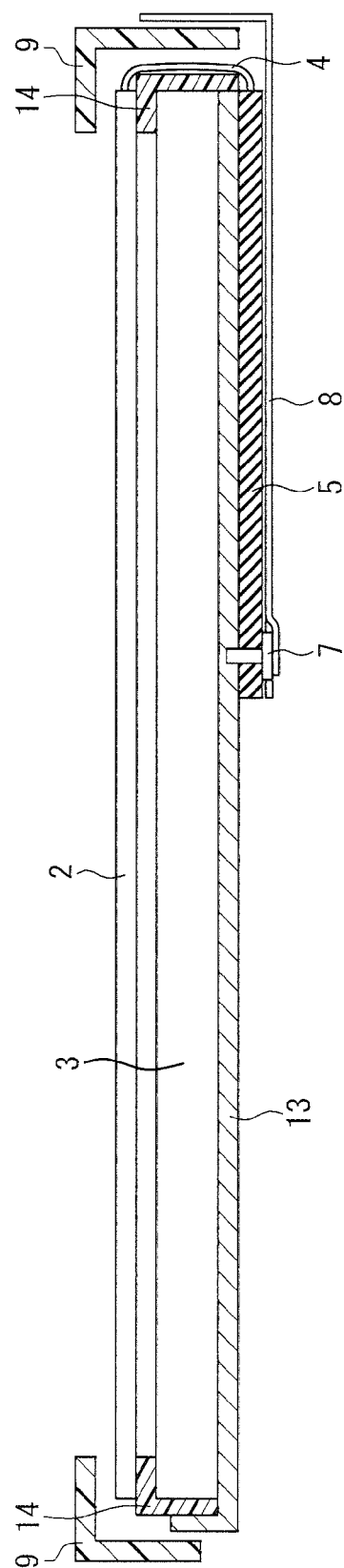
FIG. 1 is a view illustrating a lighting device and a liquid crystal display unit according to Embodiment of the present invention.

All of the above conventional methods inevitably lead to an increase in cost. Therefore, it is an object of one example of the present invention to provide a display unit that can take measures against dropping of screws at low cost.

With the above configuration, the substrate cover that covers the wiring substrate also can cover the head of the screw. Thus, the substrate cover also can have a mechanism of preventing screws from dropping off. Because of this, the mechanism against dropping of screws can be added only by machining the shape of the substrate cover. Consequently, measures against dropping of screws can be taken at low cost.

The substrate cover can be formed of resin. Thus, the mechanism against dropping of screws can be added only by modifying the shape of the resin. Consequently, measures against dropping of screws can be taken at lower cost.

The screw covering region can be separated from the other area of the substrate cover by a slit that is cut in part of the periphery of the head of the screw. Thus, a structure against dropping of screws can be provided only by slitting the substrate cover. Consequently, measures against dropping of screws can be taken at low cost.

The screw covering region may be rectangular or triangular, and one side of the rectangular or triangular screw covering region is connected to the other area of the substrate cover, and the other sides thereof are separated from the other area of the substrate cover. Thus, measures against dropping of screws can be taken with a simple configuration.

The display unit may further include a lighting device that has a light emitting surface that emits planar light and is disposed opposite to the display panel. The wiring substrate is connected to the display panel via a flexible printed circuit, and is arranged on a back surface of the lighting device on a side opposite to the light emitting surface. In the back surface of the lighting device, the substrate cover is provided so as to cover the wiring substrate.

With the above configuration, the substrate cover not only can protect the wiring substrate arranged on the back surface of the lighting device, but also can prevent screws from dropping off.

The screw can have a configuration in which an upper surface of the head is flat, and at least part of the bearing surface is conical. Thus, the substrate cover can cover the head of the screw easily. Further, it is possible to reduce the thickness of the display unit.

A liquid crystal panel can be used as the display panel, for example.

According to the present invention, in a display unit, measures against dropping of screws can be taken at low cost.

Hereinafter, preferred embodiments of a lighting device of the present invention and a liquid crystal display unit using the same will be described with reference to the drawings. In the following description, the present invention is applied to a transmission-type liquid crystal display unit. Further, the dimensions of constituent members in the respective drawings do not faithfully reflect the actual dimensions of constituent members, dimension ratio of the respective constituent members, etc.

[Embodiment]

FIG. 1 is a view illustrating a liquid crystal display unit according to Embodiment of the present invention. In FIG. 1, a liquid crystal display unit 1 of the present embodiment is provided with a liquid crystal panel 2 that is located with an upper side of FIG. 1 defined as a viewing side (display surface side) and a lighting device 3 of the present invention that is arranged on a non-display surface side of the liquid crystal panel 2 (the lower side of FIG. 1) and generates illumination light for illuminating the liquid crystal panel 2. Further, in the liquid crystal display unit 1, the liquid crystal panel 2 and the lighting device 3 are assembled and integrated into the transmission-type liquid crystal display unit 1 where illumination light from the lighting device 3 enters the liquid crystal panel 2.

The liquid crystal panel 2 includes a liquid crystal layer, and an active matrix substrate and a color filter substrate as a pair of substrates sandwiching the liquid crystal layer (not shown). The active matrix substrate includes pixel electrodes, thin film transistors (TFT) and the like (not shown) that are formed between the active matrix substrate and the liquid crystal layer in accordance with a plurality of pixels included in the display surface of the liquid crystal panel 2. Meanwhile, the color filter substrate includes color filters, counter electrodes and the like that are formed between the color filter substrate and the liquid crystal layer (not shown).

Further, the liquid crystal panel 2 is provided with a control device (not shown) that performs drive control of the liquid crystal panel 2. The display surface is driven on a pixel basis by operating the liquid crystal layer on a pixel basis, whereby a desired image is displayed on the display surface.

Note that the liquid crystal panel 2 can have any liquid crystal mode and any pixel structure. The liquid crystal panel 2 also can have any drive mode. In other words, any liquid crystal panel capable of displaying information can be used as the liquid crystal panel 2. Therefore, a detailed structure of the liquid crystal panel 2 is not illustrated in FIG. 1, and the explanation will be omitted.

Next, the liquid crystal panel 2 of the present embodiment will be described specifically also with reference to FIG. 2.

(Liquid Crystal Panel)

Figure 2:
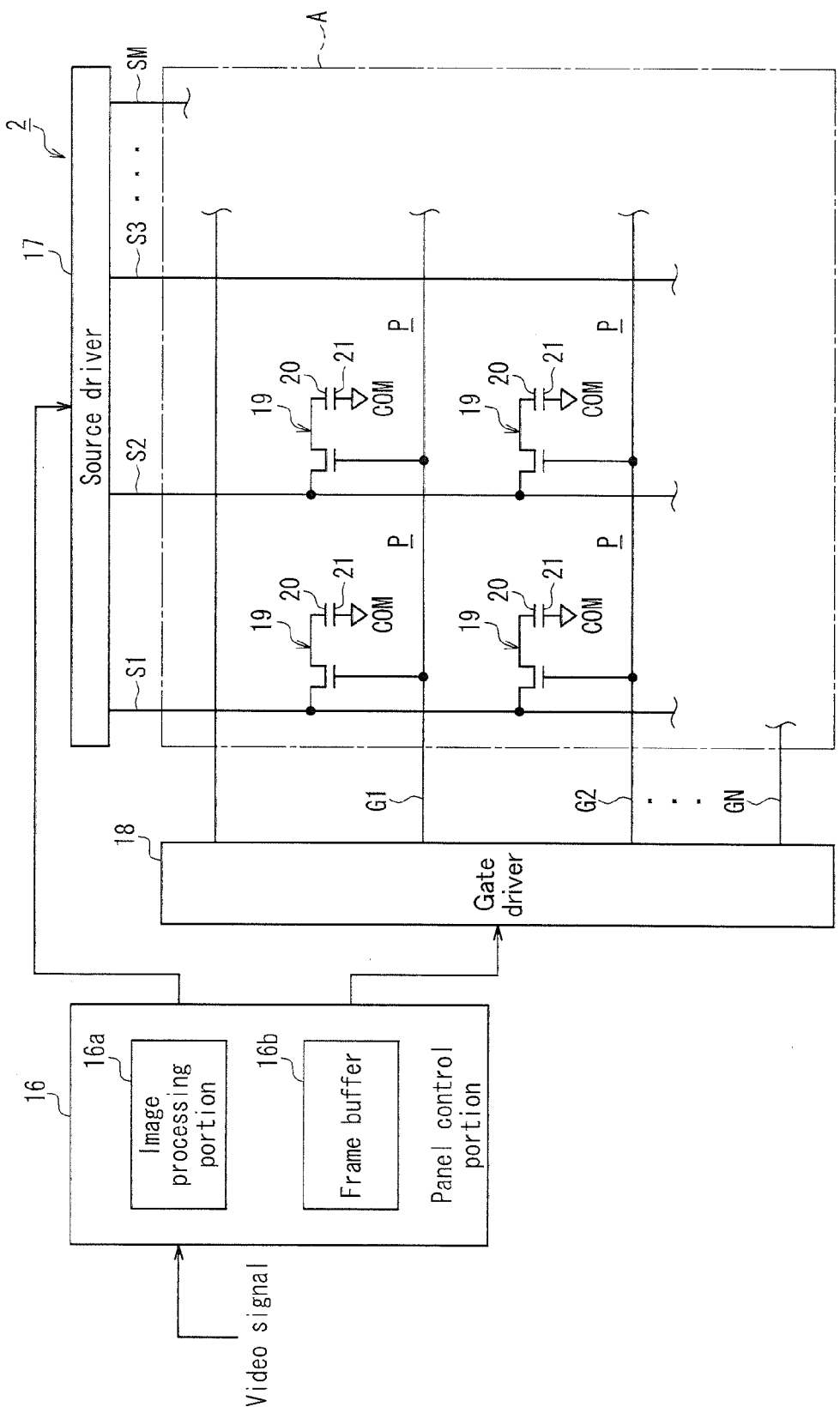
FIG. 2 is a diagram illustrating a configuration of a liquid crystal panel shown in FIG. 1.

FIG. 2 is a diagram illustrating a configuration of the liquid crystal panel shown in FIG. 1.

In FIG. 2, the liquid crystal display unit 1 (FIG. 1) is provided with a panel control portion 16 that performs drive control of the liquid crystal panel 2 (FIG. 1) as the display portion that displays information such as characters and images, and a source driver 17 and a gate driver 18 that are operated based on instruction signals from the panel control portion 16.

The panel control portion 16 can be, for example, provided in the control device and receive video signals from outside of the liquid crystal display unit 1. Further, the panel control portion 16 includes an image processing portion 16a that performs predetermined image processing on input video signals so as to generate respective instruction signals to the source driver 17 and the gate driver 18, and a frame buffer 16b that can store one frame of display data contained in the input video signals. The panel control portion 16 performs drive control of the source driver 17 and the gate driver 18 in accordance with input video signals, whereby information in accordance with the video signals is displayed on the liquid crystal panel 2.

The source driver 17 and the gate driver 18 are placed on the active matrix substrate, for example. Specifically, on the surface of the active matrix substrate, the source driver 17 is placed along the horizontal direction of the liquid crystal panel 2 in an outside region of an effective display area A of the liquid crystal panel 2 as a display panel. Further, on the surface of the active matrix substrate, the gate driver 18 is placed along the vertical direction of the liquid crystal panel 2 in the outside region of the effective display area A.

Further, the source driver 17 and the gate driver 18 are drive circuits that drive, on a pixel basis, a plurality of pixels P provided on the liquid crystal panel 2 side. The source driver 17 and the gate driver 18 respectively are connected to a plurality of source lines S1-SM (M is an integer of 2 or more, hereinafter referred to as "S" collectively) and a plurality of gate lines G1-GN (N is an integer of 2 or more, hereinafter referred to as "G" collectively). The source lines S and the gate lines G constitute data lines and scanning lines, respectively, and are arrayed in a matrix so as to cross each other on a base material (not shown) made of a transparent glass material or a transparent synthetic resin contained in the active matrix substrate. Specifically, the source lines S are provided on the base material so as to be parallel to a column direction of the matrix (the vertical direction of the liquid crystal panel 2) and the gate lines G are provided on the base material so as to be parallel to a row direction of the matrix (the horizontal direction of the liquid crystal panel 2).

Further, the pixels P are provided in the vicinity of each intersection between the source line S and the gate line G. Each of the pixels P includes the thin film transistor 19 as a switching element and a pixel electrode 20 connected to the thin film transistor 19. Each of the pixels P also includes a common electrode 21 located opposite to the pixel electrode 20, with the liquid crystal layer of the liquid crystal panel 2 being interposed therebetween. In other words, in the active matrix substrate, the thin film transistor 19, the pixel electrode 20 and the common electrode 21 are provided on a pixel basis.

Moreover, in the active matrix substrate, the plurality of pixels P are formed in areas that are partitioned in a matrix by the source lines S and the gate lines G. The plurality of pixels P include red (R), green (G) and blue (B) pixels. The RGB pixels are sequentially arranged, for example, in this order in parallel to the gate lines G1-GN. Further, the RGB pixels can display corresponding colors by color filter layers (not shown) provided on the color filter substrate side.

Further, in the active matrix substrate, based on instruction signals from the image processing portion 16a, the gate driver 18 sequentially outputs scanning signals (gate signals) with respect to the gate lines G1-GN so as to bring gate electrodes of the corresponding thin film transistors 19 into an ON state. Further, based on instruction signals from the image processing portion 16a, the source driver 17 outputs data signals (voltage signals (gradation voltage)) in accordance with brightness (gradation) of the display image with respect to the corresponding source lines S1-SM.

(Configuration Example of Liquid Crystal Display Unit)

The lighting device 3 shown in FIG. 1 is an example of a so-called edge-light module. The lighting device 3 includes light-emitting diodes (not shown) as an example of a light source, and a light-guiding plate that guides light from the light-emitting diodes to a predetermined propagation direction (lateral direction of FIG. 1) and outputs the light to the liquid crystal panel (object to be irradiated) 2 side. The light-guiding plate is made of, for example, a transparent synthetic resin such as acrylic resin having a rectangular cross section. The light-guiding plate has a light incident surface that is opposite to the light-emitting diodes and receives light from the light-emitting diodes, a light emitting surface that emits light toward the liquid crystal panel 2 side, and an opposite surface that is opposite to the light emitting surface.

The lighting device 3 further may include, for example, a reflection plate provided on, e.g., the lower side of the light-emitting diodes and the light-guiding plate, and optical members provided between the light-guiding plate and the liquid crystal panel 2. As the optical members, a diffusion sheet, a prism sheet and a reflective polarizing sheet can be provided in this order from the light-guiding plate side, for example.

The lighting device 3 includes a bottomed chassis 13 that houses the light-emitting diodes, the light-guiding plate, the diffusion sheet, the prism sheet, the reflective polarizing sheet, etc. A bezel 14 supports side surfaces of the lighting device 3. The bezel 14 extends from the side surfaces to an upper surface edge (light emitting surface side) of the lighting device 3. In an example shown in FIG. 1, the bezel 14 is a frame body that has an L-shaped cross section and an opening. The bezel 14 is assembled with the chassis 13 so as to form an external case of the lighting device 3. Further, in the present embodiment, an upper surface of the bezel 14 holds the liquid crystal panel 2. Incidentally, as a member different from the bezel 14, for example, a P chassis for holding the liquid crystal panel 2 may be provided on the upper surface of the bezel 14.

On the display surface side of the liquid crystal panel 2, a frame 9 is provided that has an opening corresponding to the display surface and covers an upper surface edge and side surfaces of the liquid crystal display unit 1. As described above, the liquid crystal display unit can include a fixing member (bezel 14 in the above example) that holds the liquid crystal panel 2 and the lighting device 3 while keeping a predetermined positional relationship therebetween, a housing member (chassis 13) that forms a bottom portion of the lighting device 3, and a frame member (frame 9) that covers the side surfaces of the liquid crystal display unit and the perimeter of the display surface. Incidentally, the chassis 13, the bezel 14 and the frame 9 can be formed of resin or metal.

The lighting device 3 has a light emitting surface that emits planar light. The lighting device 3 and the liquid crystal panel 2 are arranged so that the light emitting surface corresponds to a display region of the liquid crystal panel 2. The liquid crystal panel 2 is connected to a wiring substrate 5 via a FPC (Flexible Printed Circuit) 4.

The wiring substrate 5 is arranged on the back surface of the lighting device 3 on the side opposite to the light emitting surface. Specifically, the FPC 4 is led out from the liquid crystal panel 2 arranged on the light emitting surface side of the lighting device 3, extends along the side surface of the lighting device 3, and is connected to the wiring substrate 5 arranged on the back surface of the lighting device 3.

At an end portion of the liquid crystal panel 2, electrode terminals are provided that are led out from metal wiring formed in an image display region where an image is displayed, and a wiring pattern of the FPC 4 is connected to the electrode terminals. At least part of the wiring pattern of the FPC 4 is connected further to wiring of the wiring substrate 5. In the wiring substrate 5, circuits and elements for controlling the liquid crystal panel 2 are arranged. For example, the wiring substrate 5 includes various signals for displaying images that are supplied to the liquid crystal panel 2, circuits that generate power supply voltages for electric circuit elements formed on the liquid crystal panel 2, ICs, and the like. As described above, since the wiring substrate 5 can include wiring for controlling the liquid crystal panel 2, it also can be referred to as a control substrate. Incidentally, circuit elements for giving a predetermined signal to the liquid crystal panel are often mounted on the FPC 4.

Figure 3:
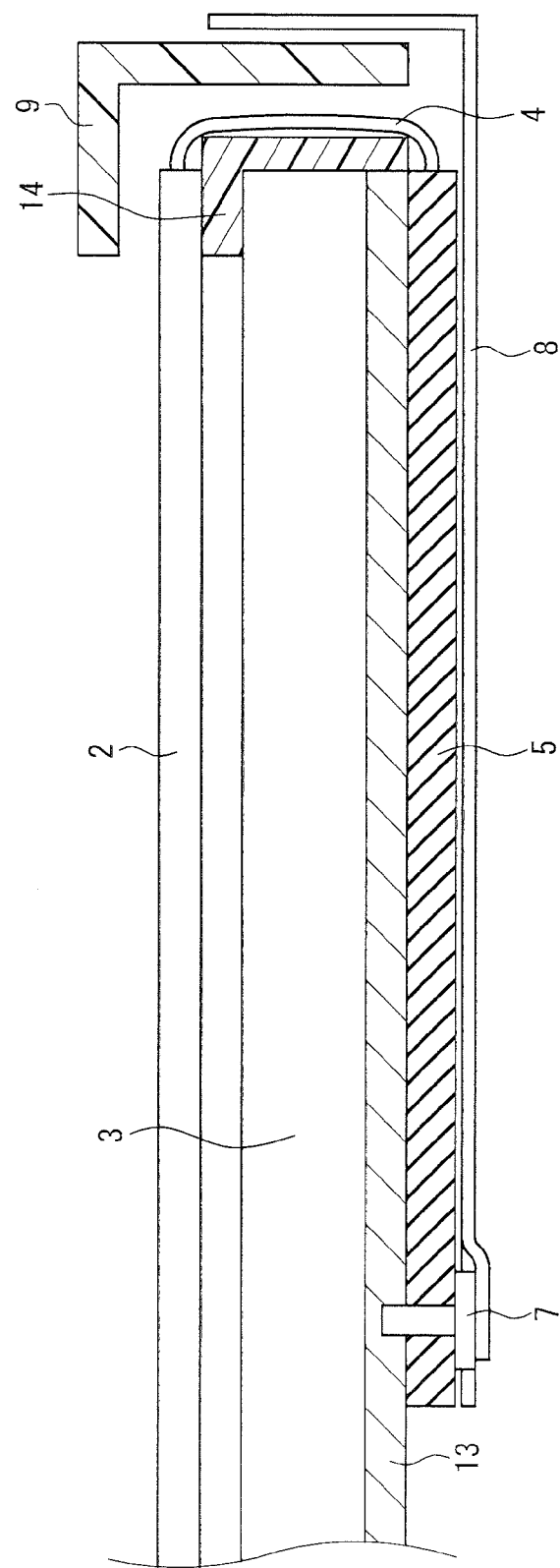
FIG. 3 is an enlarged cross-sectional view illustrating a configuration of main portions of the liquid crystal display unit shown in FIG. 1

FIG. 3 is an enlarged cross-sectional view illustrating a configuration of main portions of the liquid crystal display unit shown in FIG. 1. As shown in FIG. 3, a screw 7 passing through the wiring substrate 5 and reaching the chassis 13 fixes the wiring substrate 5 to the liquid crystal display unit. A substrate cover 8 is provided so as to cover the wiring substrate 5. The substrate cover 8 covers the entire wiring substrate 5, and part thereof extends to the side surface of the frame 9. The substrate cover 8 can prevent a wiring pattern of the wiring substrate 5 from being exposed. A thickness of the substrate cover 8 can be about 0.1 mm to 0.2 mm, for example.

Figure 4:
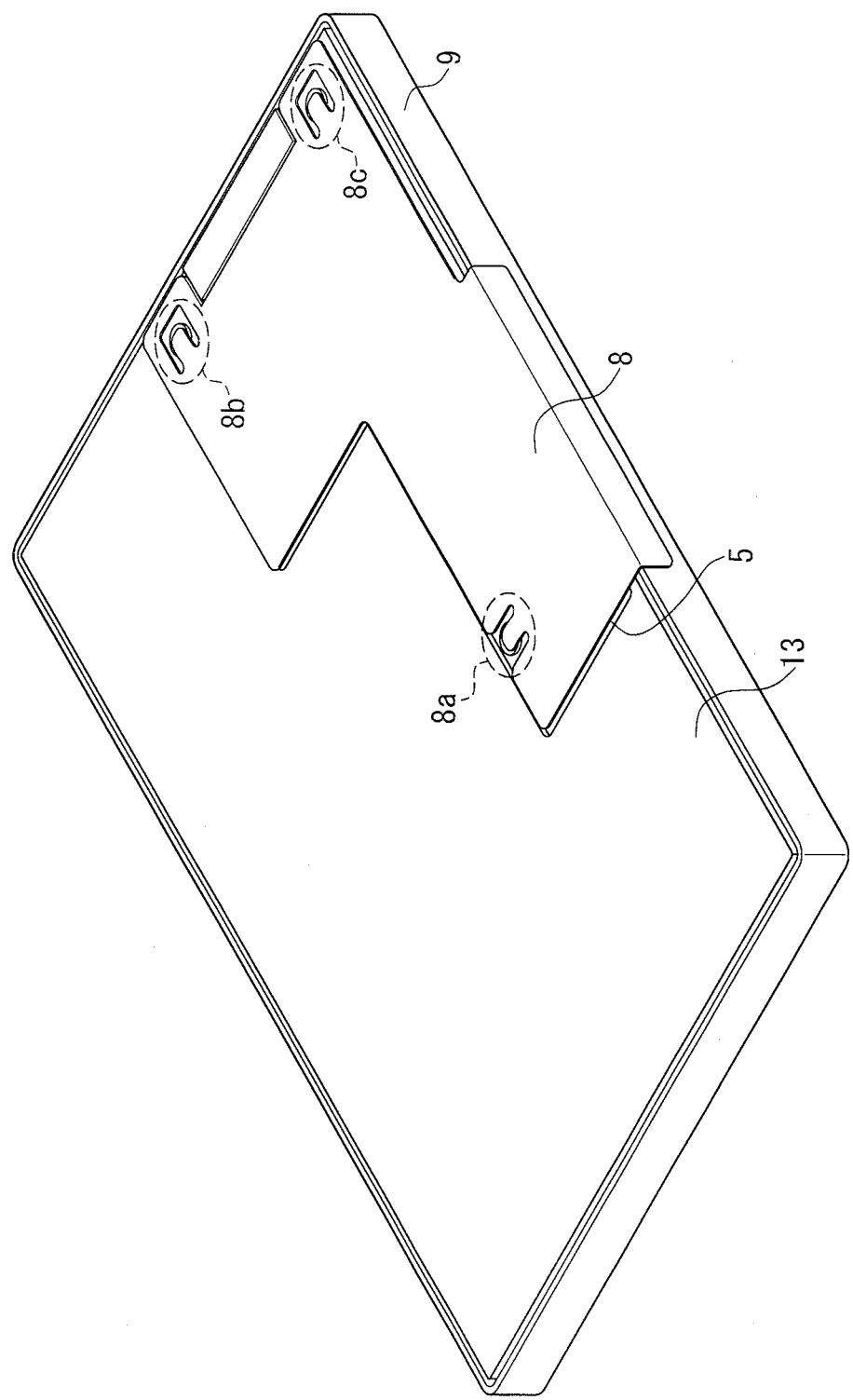
FIG. 4 is a perspective view of the liquid crystal display unit shown in FIGS. 1 and 3 seen from the backside.

FIG. 4 is a perspective view of the liquid crystal display unit shown in FIGS. 1 and 3 seen from the backside. In an example shown in FIG. 4, in the wiring substrate 5, screws 7 are provided at three locations. The substrate cover 8 has screw covering regions (8a, 8b, 8c) for covering heads of the respective screws 7. The screw covering regions are separated from the other area of the substrate cover 8 in part of their peripheral regions. In other words, portions of the substrate cover 8 that cover the heads of the screws 7 are disconnected from the other area of the substrate cover in part of their peripheries. As described above, by forming partially disconnected regions in the substrate cover 8 in the peripheries of the heads of the screws, the substrate cover 8 can hold the heads of the screws, thereby preventing the screws from dropping off. At the same time, the substrate cover 8 can be prevented from being creased unnaturally due to steps formed by the heads of the screws.

Here, for example, the substrate cover 8 can be formed of resin, such as PET (polyethylene terephthalate). Forming the substrate cover 8 using resin can reduce the material cost and the processing cost.

Further, it is preferable that, at least in the screw covering regions, the substrate cover 8 is adhered to the wiring substrate 5 or to the heads of the screws. For example, a double-sided tape or an adhesive can be used as the adhesion means. The entire substrate cover 8 may be adhered to the wiring substrate 5, or part of the substrate cover 8 including the screw covering regions may be adhered to the wiring substrate 5.

In the examples shown in FIGS. 1, 3 and 4, the substrate cover 8, which prevents the wiring substrate 5 arranged on the back surface of the liquid crystal display unit from being exposed, also can have a mechanism of preventing screws from dropping off. Because of this, without adding new constituent elements, measures against dropping of screws can be taken. Consequently, the dropping of screws can be prevented at low cost.

Figure 5:
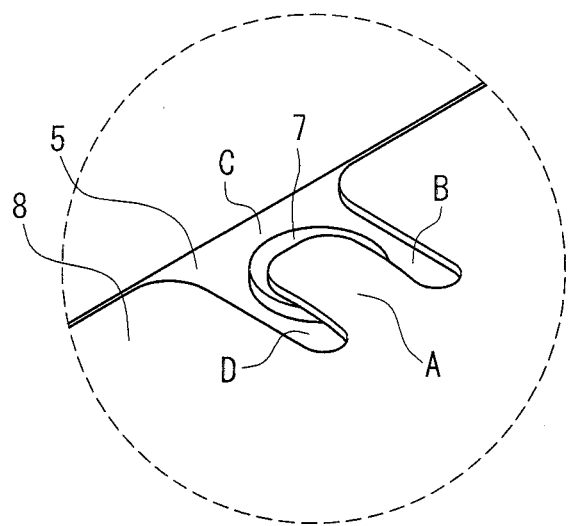
FIG. 5 is a view showing a configuration example of a screw covering region of a substrate cover.

FIG. 5 is a view showing a configuration example of the screw covering region of the substrate cover 8. In the example shown in FIG. 5, the screw covering region is rectangular. One side of the screw covering region is connected to the other area of the substrate cover 8, and the other three sides of the screw covering region are separated from the substrate cover 8. Specifically, around the screw covering region, openings B, C and D where the substrate cover 8 is not provided are formed. In other words, in the rectangular screw covering region, the openings B, C and D are formed in the three sides, and a connection portion A is formed in the other side. The substrate cover 8 can be produced by molding of resin, for example.

Modification Example 1

Figure 6:
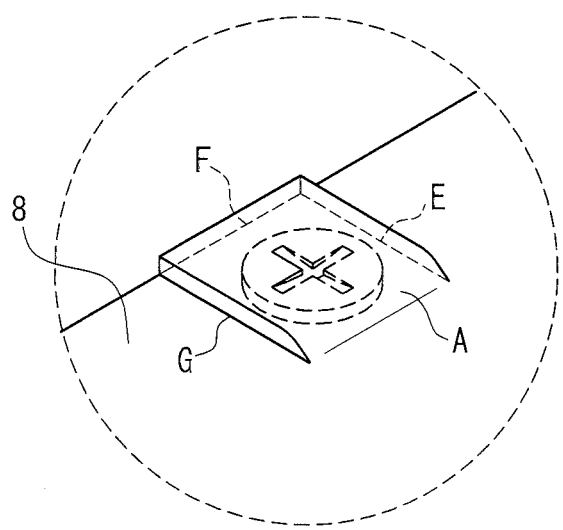
FIG. 6 is a view showing another configuration example of the screw covering region of the substrate cover.

FIG. 6 is a view showing another configuration example of the screw covering region of the substrate cover 8. In the example shown in FIG. 6, the screw covering region is separated from the other area of the substrate cover by slits that are cut in part of the periphery of the head of the screw. Specifically, in two opposing sides of the rectangular screw covering region, slits G and E are formed. Another side is an end portion F of the substrate cover 8, and a side opposite to the end portion F is the connection portion A, which is connected to the other area of the substrate cover 8. The screw covering region shown in FIG. 6 can be formed by a simple step of, e.g., slitting the substrate cover 8 using a cutter. The substrate cover 8 shown in FIG. 6 can be produced by cutting a resin plate using a cutter, etc.

Modification Example 2

Figure 7:
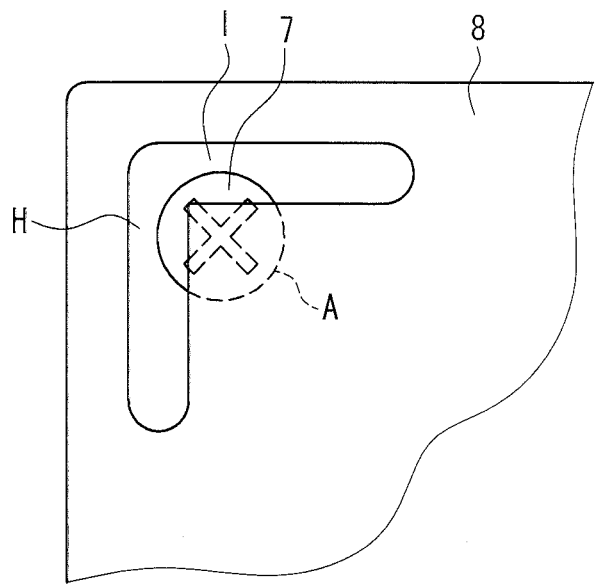
FIG. 7 is a view showing still another configuration example of the screw covering region of the substrate cover.

FIG. 7 is a view showing still another configuration example of the screw covering region of the substrate cover 8. In the example shown in FIG. 7, the screw covering region is triangular. Specifically, two sides of the triangular screw covering region include openings H and I, and are separated from the other area of the substrate cover 8. The other side sandwiched by the two sides with the openings H and I is the connection portion A, which is connected to the other area of the substrate cover 8. Further, for example, the triangular screw covering region can be formed also by arranging a screw such that a corner portion of the substrate cover 8 is positioned above the head of the screw.

[Configuration Example of Screw]

Figure 8:
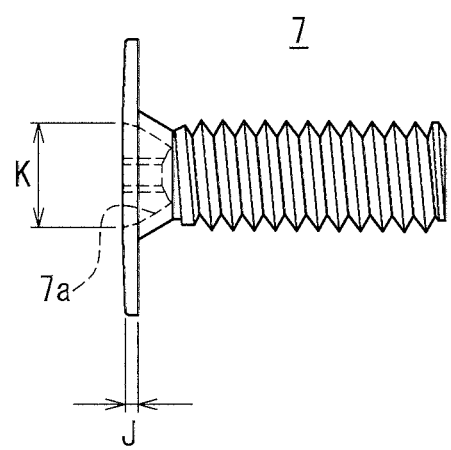
FIG. 8 is a view showing an example of a screw (vis).

FIG. 8 is a view showing an example of the screw (vis) that can be used in the above Embodiment. In the example shown in FIG. 8, an upper surface of the head of the screw is flat, and part of the bearing surface is conical. Specifically, a bottom surface of the head of the screw is inclined relative to an axial direction of the screw. It also can be said that the base of the shank or the bottom surface of the head of the screw is tapered. As described above, flatting the upper surface of the head can reduce a protrusion of the substrate cover 8 that covers the head of the screw. Such a structure is advantageous to reduce the thickness of the liquid crystal display unit. A thickness J of the head of the screw is preferably 0.1 mm to 0.5 mm, for example.

Further, part of the bearing surface is conical, and a hole for rotation by a tool is formed along the conical shape. In other words, a hole of the head of the screw is formed along the tapered shape of the bottom surface of the head of the screw. Thus, a diameter K of the hole can be set large, thereby increasing torque for fastening the screw.

Incidentally, the shape of the screw is not limited to the example shown in FIG. 8. For example, the head may be thin and cylindrical, and the bearing surface may be flat, not conical. The head may have a pan shape whose upper surface is rounded, a raised countersunk shape, a truss shape or other shapes. The shape of the screw hole is not limited particularly, and the hole may have a cross shape, a slot shape, a hexagon shape or other shapes, for example.

Although the Embodiment of the present invention is described above, the present invention is not limited to the above examples. For example, a screw passing through the wiring substrate 5 and the chassis 13 and reaching the lighting device 3 may be used. Thereby, the chassis 13, the lighting device 3 and the wiring substrate 5 can be fixed to each other. Further, members fixed by the screw are not limited to these. For example, the screw can fix various combinations of members, such as the bezel 14 and the wiring substrate, the bezel 14 and the lighting device, the frame and the chassis 13, and other combinations.

Further, the panel control portion 16 shown in FIG. 2 is not limited to the form of being provided in the liquid crystal panel 2 as described above. For example, the panel control portion 16 may be provided in the wiring substrate 5, and the gate driver 18 and the source driver 17 may be provided on the FPC 4.

Further, although the thickness of the lighting device 3 is uniform in FIG. 1, for example, a portion of the lighting device 3 where the wiring substrate 5 is provided can be formed thinner than the other portion. In this case, the light-guiding plate provided in the lighting device 3 can be formed to be thinner with distance from an entrance surface of light from light sources, whereby the lighting device 3 can be thinned accordingly. By arranging light sources on a side surface of the lighting device 3 that is opposite to the side surface on the wiring substrate 5 side, the portion of the lighting device 3 where the wiring substrate 5 is provided can be thinned. Thus, the thickness of the liquid crystal display unit can be reduced further.

Further, the present invention can be applied also to display units other than the liquid crystal display unit. For example, the present invention can be applied widely to various kinds of display units, such as an organic or an inorganic EL display, a field emission cold cathode display unit, and a plasma display panel (PDP). Further, uses of the display unit to which the present invention is applied are not limited particularly, and the present invention can be applied to display units for various uses, such as a game terminal, a car navigation system, a personal computer, a television, a video camera, a digital camera, various inspection devices, a display installed in a machine tool or a production line, and the like. Particularly, since display units used in IA (industrial application) may be installed in machine tools and the like to which slight vibrations are applied constantly, the invention of the present application that can take measures against dropping of screws can be applied thereto suitably.

INDUSTRIAL APPLICABILITY

The present invention is useful with respect to a display unit having a mechanism of preventing screws from dropping off.

DESCRIPTION OF REFERENCE NUMERALS

2 liquid crystal panel
3 lighting device
4 FPC
5 wiring substrate
7 screw
8 substrate cover
9 frame
13 chassis
14 bezel

The invention claimed is:

1. A display unit provided with a display panel, comprising:
    a wiring substrate in which wiring that is led out from the display panel is provided;
    a screw that fixes the wiring substrate to the display unit; and
    a substrate cover that covers the wiring substrate,
    wherein the substrate cover has a screw covering region that covers a head of the screw, and
    a peripheral portion of the screw covering region is separated from at least one other portion of the substrate cover adjacent to the peripheral portion of the screw covering region.

2. The display unit according to claim 1, wherein the substrate cover is formed of resin.

3. The display unit according to claim 1, wherein the screw covering region is separated from the at least one other portion of the substrate cover by a slit that is cut in part of the peripheral portion of the screw covering region.

4. The display unit according to claim 1,
    wherein the screw covering region is rectangular or triangular, and
    one side of the rectangular or triangular screw covering region is connected to the at least one other portion of the substrate cover, and remaining other sides of the rectangular or triangular screw covering region are separated from the at least one other portion of the substrate cover.

5. The display unit according to claim 1, further comprising a lighting device that has a light emitting surface that emits planar light and is disposed opposite to the display panel, wherein the wiring substrate is connected to the display panel via a flexible printed circuit, and is arranged on a back surface of the lighting device on a side opposite to the light emitting surface, and in the back surface of the lighting device, the substrate cover is provided so as to cover the wiring substrate.

6. The display unit according to claim 1, wherein an upper surface of the head of the screw is flat, and at least part of a bearing surface thereof is conical.

7. The display unit according to claim 1, wherein a liquid crystal panel is used as the display panel.

* * * * *